US007009839B2

(12) United States Patent
Clinard

(10) Patent No.: US 7,009,839 B2
(45) Date of Patent: Mar. 7, 2006

(54) ADJUSTABLE POWER SUPPLY HOUSING WITH COMPENSATING AIR BAFFLE

(75) Inventor: Kristopher Michael Clinard, Fuquay Varina, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/877,678

(22) Filed: Jun. 25, 2004

(65) Prior Publication Data

US 2005/0286236 A1 Dec. 29, 2005

(51) Int. Cl.
*G06F 1/16* (2006.01)

(52) U.S. Cl. ........................ 361/685; 361/690; 174/98; 271/162

(58) Field of Classification Search ........ 361/690–693, 361/679–687, 724–727; 174/50, 68.3, 96–98; 271/162, 145; 312/223.1–223.6
See application file for complete search history.

(56) References Cited

U.S. PATENT DOCUMENTS 4,399,485 A 8/1983 Wright et al. ............... 361/690
4,953,058 A 8/1990 Harris ........................ 361/693
5,282,114 A 1/1994 Stone ......................... 361/687
5,918,875 A * 7/1999 Masley et al. .............. 271/162
6,141,213 A * 10/2000 Antonuccio et al. ........ 361/687
6,888,069 B1 * 5/2005 Chen et al. ............... 174/99 R

OTHER PUBLICATIONS

Bucher et al., Flexible Between-Board Air Baffle, IBM Technical Disclosure Bulletin, vol. 21 No. 10, Mar. 1979.
Barina et al., Air Baffle for Planar Memory Cooling, IBM Technical Disclosure Bullentin, vol. 35, No. 5, Oct. 1992.

* cited by examiner

*Primary Examiner*—Hung Van Duong
(74) *Attorney, Agent, or Firm*—Joseph P. Lally; Martin J. McKinley

(57) ABSTRACT

An assembly for housing a power supply unit within a data processing system includes a carrier bracket for attaching to the power supply unit, a housing tray to engage the bracket moveably and define a size adjustable space for receiving the power supply unit, and a baffle hinged to the tray. The baffle covers a portion of the space and is moveable relative to the tray. The bracket and tray include complementary slide tracks enabling the bracket to moveably engage the tray. The baffle is hinged via pivot points engaged in baffle tracks in two of the tray sidewalls. The baffle may define a first gap between a hinged edge of the baffle and a sidewall of the tray and a second gap between a distal edge of the baffle and the bracket face plate. The baffle may include a plurality of extendible baffle plates to alter the baffle dimensions.

12 Claims, 4 Drawing Sheets

ADJUSTABLE POWER SUPPLY HOUSING WITH COMPENSATING AIR BAFFLE

BACKGROUND

1. Field of the Present Invention

The present invention is in the field of power supplies for data processing systems and more particularly the housings in which such power supplies are enclosed.

2. History of Related Art

Data processing systems including desktop computers, server systems, and so forth, require power supplies to provide a source of DC voltage to the system components. The different configurations of different systems have, in the past, forced system manufacturers to use unique power supplies for each system. Specifically, the different mechanical specifications and air flow requirements of different systems require unique power supply configurations, even in cases where the electrical requirements of different systems are the same. In such cases, manufacturers tend to produce or procure a unique power supply configuration for each of the various mechanical specifications and air flow requirements. Alternatively, manufacturers may attempt to conform the dimensions and other mechanical features of a given system to a particular power supply configuration. Both of these alternatives have significant drawbacks including increased costs, increased design time, and mechanical designs that are potentially less than optimal. It would be desirable, therefore, to implement a mechanism that enabled system manufacturers to conform a single power supply to multiple system configurations without compromising the mechanical or thermal characteristics of the system.

SUMMARY OF THE INVENTION

The identified objective is achieved by an assembly for housing a power supply unit within a data processing system according to the present invention. One embodiment of the assembly includes a carrier bracket for attaching to the power supply unit, a housing tray to engage the carrier bracket moveably and define a size adjustable space for receiving the power supply unit, and a baffle hinged to the housing tray. The baffle covers a portion of the space and is moveable relative to the housing tray. The bracket and tray include complementary slide tracks enabling the carrier to moveably engage the tray. The c-shaped carrier bracket includes a face plate and a parallel pair of arms. The housing tray includes a rectangular base and sidewalls on three of the four edges of the rectangle perimeter. The baffle is hinged via pivot points engaged in baffle tracks in two of the housing tray sidewalls. The baffle may define a first gap between a hinged edge of the baffle and a sidewall of the housing tray and a second gap between a distal edge of the baffle and the bracket face plate. The baffle may include a plurality of extendible baffle plates to alter the baffle dimensions.

BRIEF DESCRIPTION OF THE DRAWINGS

Other objects and advantages of the invention will become apparent upon reading the following detailed description and upon reference to the accompanying drawings in which.

Figure 1:
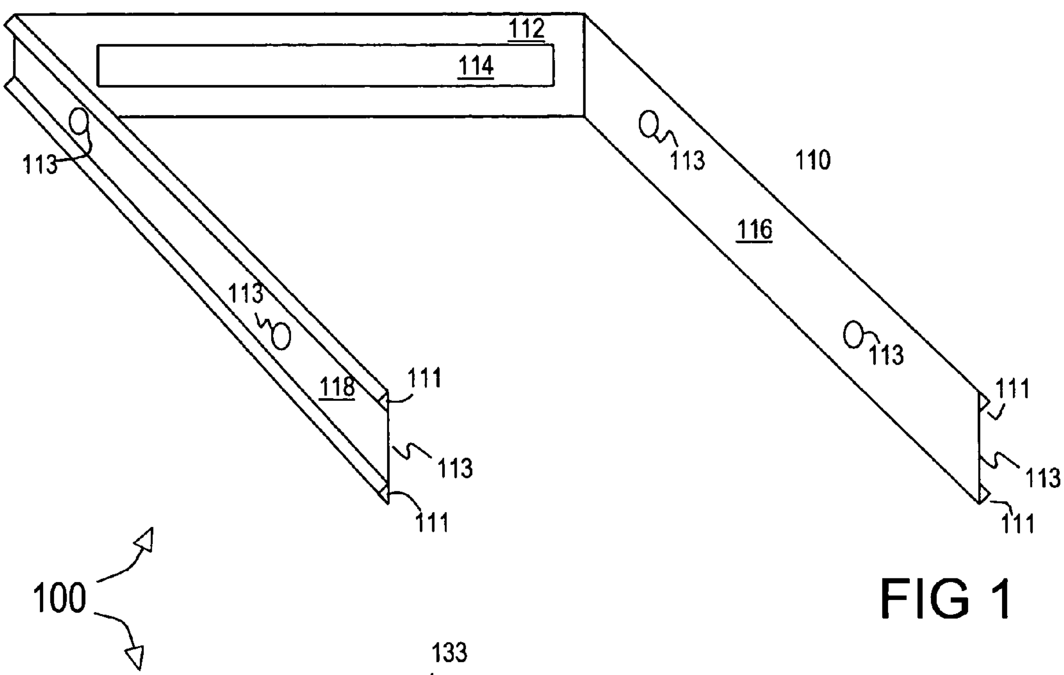
FIG. 1 is a perspective view of a bracket element of an adjustable power supply housing according to one embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Generally speaking, the present invention encompasses an adjustable housing for a data processing system power supply configuration. The housing is adjustable to enable the housing to conform its physical dimensions to the space available in a given system. The housing also includes a baffle that can be positioned as desired to obtain a desired air flow configuration. The housing is suitably employed, for example, in a system having multiple openings, slots, or bays for a power supply module where two of the bays may have different dimensions.

Figure 2:
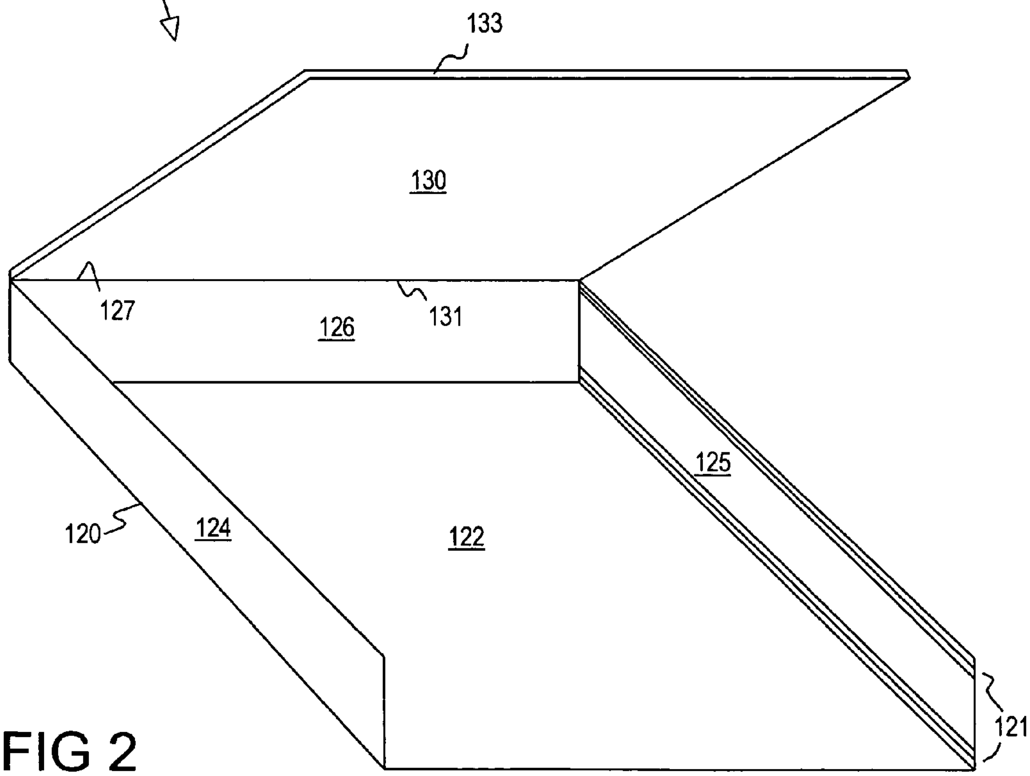
FIG. 2 is a perspective view of a carrier bracket element and an adjustable baffle element of a power supply housing according to one embodiment of the present invention.

Referring now to FIG. 1 and FIG. 2, selected elements of a power supply assembly 100 according to one embodiment of the present invention are depicted. In the depicted embodiment, assembly 100 includes a carrier bracket 110, a housing tray 120, and a baffle 130. Each of these elements may be constructed of aluminum or another electrically and thermally conductive material. Carrier bracket 110 as depicted in FIG. 1 includes a face plate 112 that includes or defines an opening 114 through which power supply cabling can pass. First and second arms 116 and 118 of carrier bracket 110 extend in a common direction at 90° angles from opposing ends of face plate 112 such that arms 116 and 118 and face plate 112 form a "C" shaped carrier bracket 110. In the depicted embodiment, the exterior surfaces of arms 116 and 118 include a pair of sliding tracks 111 running the length of arms 116 and 118 that enable carrier bracket 110 to attach to housing tray 120 in a manner the permits carrier bracket 110 to slide relative to housing tray 120. Each arm 116 and 118 also includes two or more circular openings 113 useful for securing carrier bracket 110 to a power supply unit (not depicted) or to the housing tray 120.

Referring to FIG. 2, housing tray 120 includes a rectangular base plate 122 and sidewalls 124, 125, and 126 attached to three of the four edges that form the perimeter of base plate 122. The sidewalls extend in a common direction from base plate 122 at a 90° angle with sidewalls 124 and 125 being parallel to each other. The height of sidewalls 124–126 is generally in the range of 1 to 3 inches and is sufficient to contain a power supply unit. The interior surface of sidewalls 124 and 125 include sliding tracks 121 that receive complementary sliding tracks 111 on the exterior sidewalls of the arms 116 and 118 of carrier bracket 110.

Baffle 130 is a substantially rectangular plate that is hinged, at a first edge 131, to housing tray 120 and can pivot about first edge 131 from an open position (shown in FIG. 2) to a closed position in which baffle 130 is parallel to base plate 122 and in contact with upper edges of the housing tray sidewalls 124–126. The ability to pivot baffle 130 to an open position facilitates inserting and removing a power supply unit into and from power supply housing 100. In addition to its ability to pivot about its first edge 131, the position and size of baffle 130 is preferably adjustable.

Figure 3:
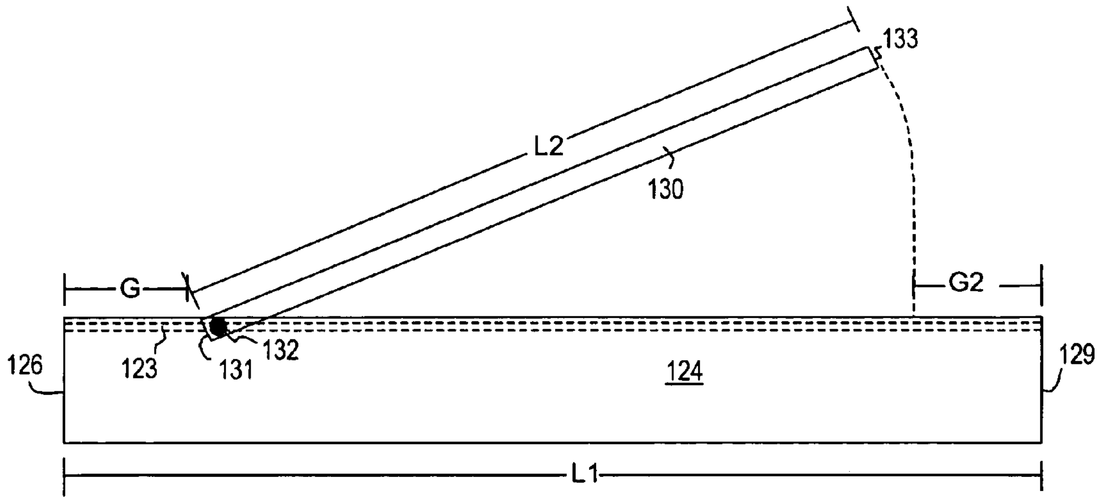
FIG. 3 is a side view of one embodiment of the carrier bracket and baffle of FIG. 2.
Figure 4:
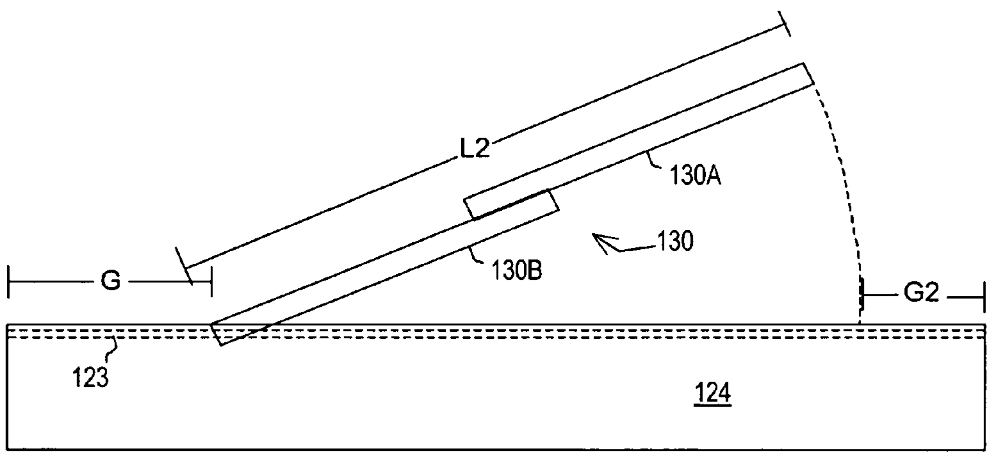
FIG. 4 is a side view of a second embodiment of the carrier bracket and baffle of FIG. 2.

Referring to FIG. 3 and FIG. 4, housing 100 is depicted with two implementations of an adjustable embodiment of baffle 130. In the embodiment depicted in FIG. 3, baffle 130 is a single piece, fixed size element. Pivot points 132 of baffle 130, about which baffle 130 pivots, are moveable within a baffle track 123 defined in the housing tray sidewalls 124 and 125 (where the baffle tracks 123 and the sliding tracks 121 are displaced from each other). Baffle tracks 123 enable first edge 131 of baffle 130 to move, in a plane substantially parallel to base plate 122, relative to an upper edge 127 of housing tray rear sidewall 126 and thereby define a gap (G) between first edge 131 of baffle 130 and upper edge 127 (FIG. 2) of housing tray rear sidewall 126. In one configuration, the length (L1) of housing tray 120 is approximately equal to the sum of the length (L2) of baffle 130 and the gap (G). In this configuration, the distal edge 133 of baffle 130 will just extend to the distal edges 129 of housing tray sidewalls 124 and 125 and the air gap (G) is defined between first edge 131 of baffle 130 and rear sidewall 126 of housing tray 120. In other implementations, the length L2 of baffle 130 may be shorter than the difference between L1 and G such that distal edge 133 of baffle 130 does not extend all the way to the distal edges 129 of sidewalls 124 and 125 thereby leaving a gap G2.

In the embodiment depicted in FIG. 4, baffle 130 is a multi-piece element including two (or more) extendible and retractable elements 130A and 130B such that the length L2 of baffle 130 is adjustable. In this embodiment, hinge point 132 of baffle 130 is still moveable within baffle track 123 of the housing tray sidewalls, enabling adjustment of the size of the gap G. If baffle 130 is positioned appropriately such that the gap G is within a specified range, extendible/retractable elements 130A and 130B of baffle 130 can be adjusted as desired to alter the size of or eliminate gap G2.

Figure 5:
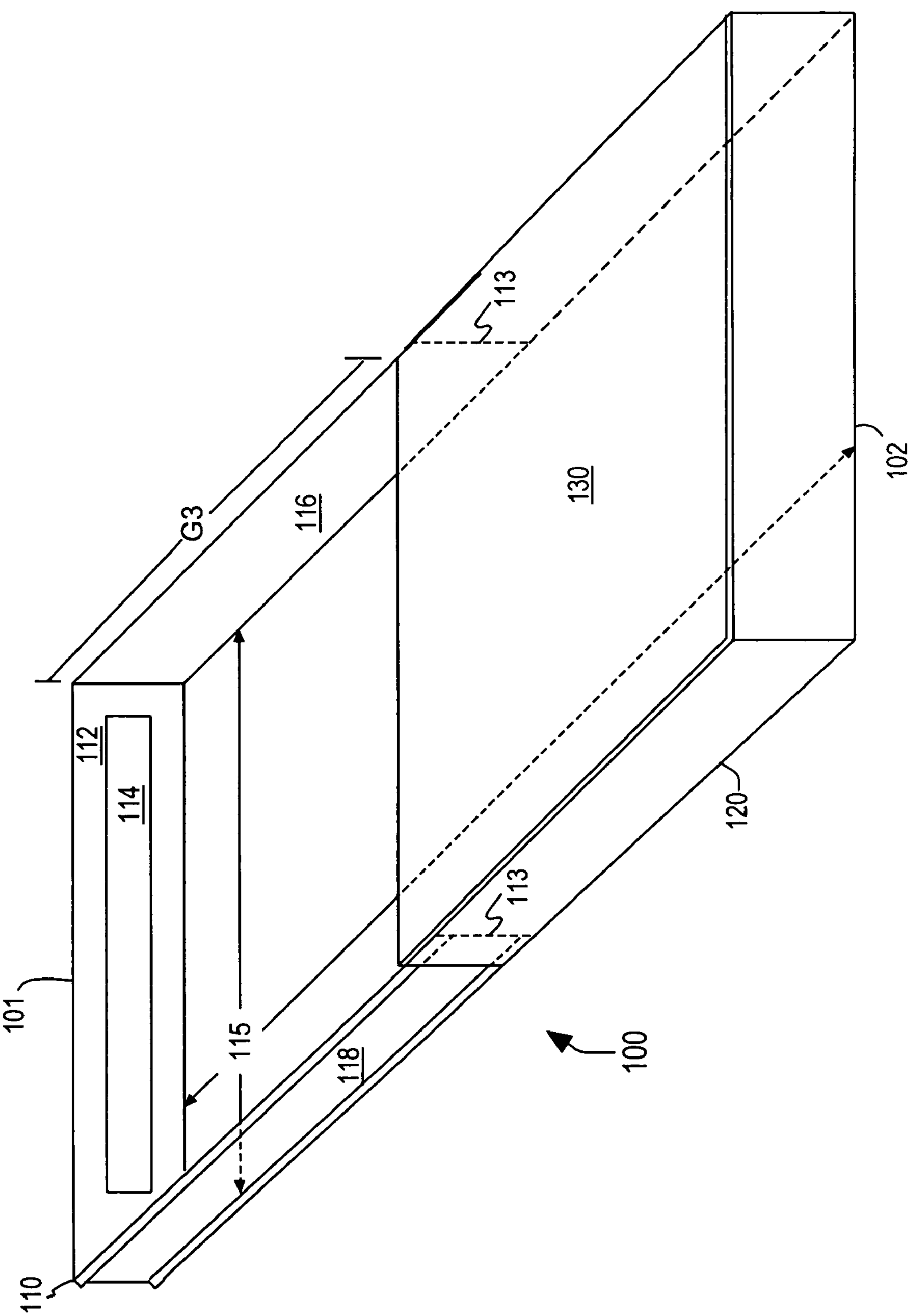
FIG. 5 is a perspective view of the bracket element of FIG. 1 and the carrier bracket/baffle elements of FIG. 2 interconnected.

Referring now to FIG. 5, the elements of housing 100 are shown together to illustrate the manner in which the elements interconnect. In the depicted embodiment, carrier bracket 110 engages or is otherwise connected to housing tray 120 and baffle 130 to form housing 100. Baffle 130 covers at least a portion of a space 115 defined by the engaged carrier bracket and housing tray. Space 115 is suitable for receiving a power supply unit. Because carrier bracket 110 and housing tray 120 engage each other "moveably" (i.e., carrier bracket 110 is moveable with respect to housing tray 120 when the two elements are engaged), the space 115 is adjustable. In the depicted embodiment, carrier bracket 110 engages housing tray 120 by threading the distal ends 113 of bracket arms 116 and 118 into the sliding tracks 121 in housing tray sidewalls 124 and 126 such that the base plate 112 of carrier bracket 110 defines a first end 101 of housing 100 while rear sidewall 126 of housing tray 120 defines a second end 102 of housing 100. The gap G3 representing the distance from distal edge 133 of baffle 130 to base plate 112 of carrier bracket 110 is determined, at least in part, by the relative positions of carrier bracket 110 and housing tray 120 (i.e., by the extent to which carrier bracket 110 is inserted into housing tray 120). The gap G3 is also affected by the positioning and amount of extension (when applicable) of baffle 130. In the illustration of FIG. 5, the first edge 131 of baffle 130 is aligned with rear sidewall 126 of housing tray 120 such that there is no gap G (as shown in FIGS. 3 and 4). It will be appreciated that a power supply unit can be positioned within housing 100 and the housing may be adjusted to achieve various final dimensions of the housing 100 as well as varying dimensions of one or more air gaps defined by the housing.

Figure 6:
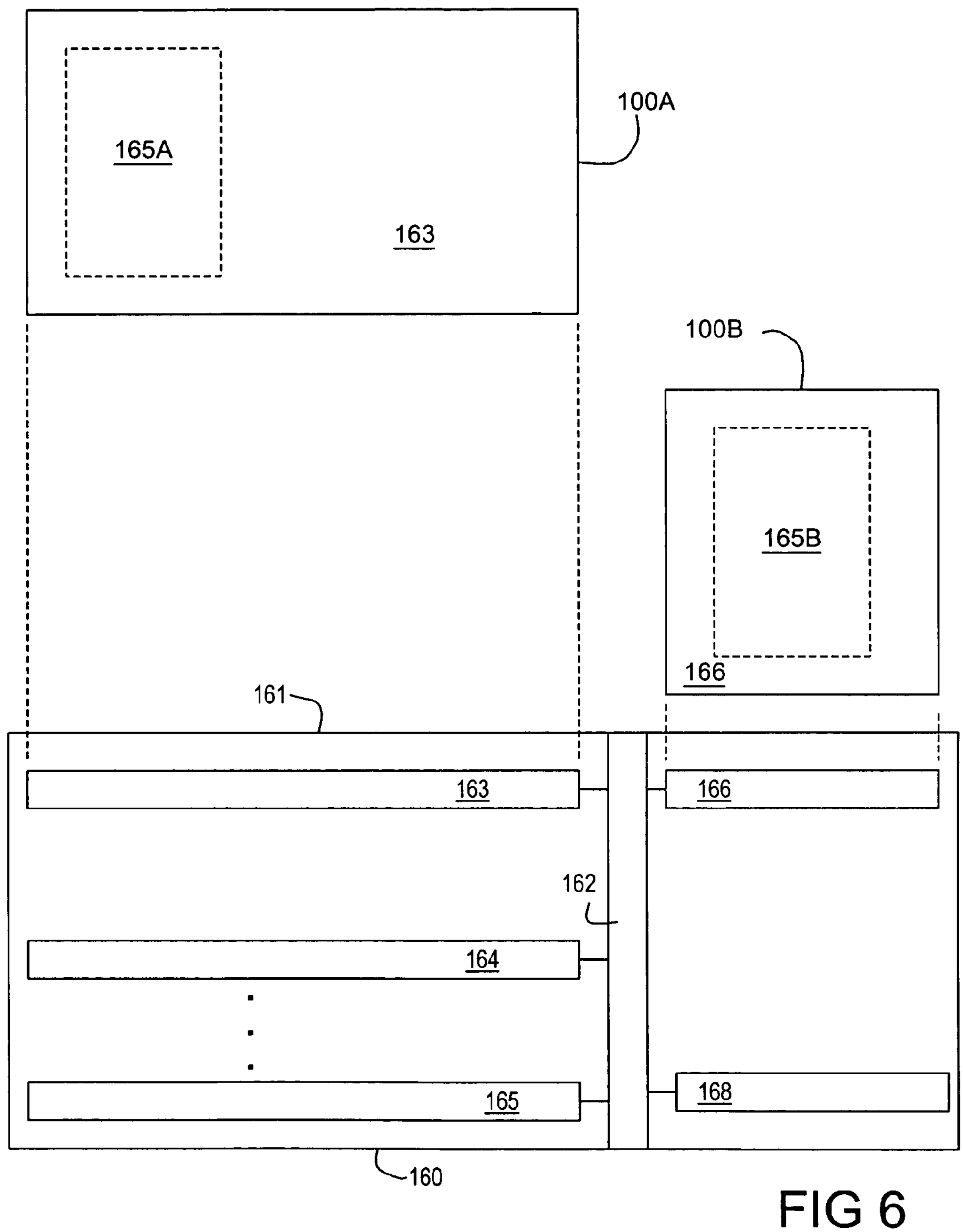
FIG. 6 depicts selected elements of a data processing system into which the adjustable power supply housing of FIG. 5 can be gainfully employed.

Referring now to FIG. 6, an application of the present invention is illustrated as used in a particular data processing system. FIG. 6 shows a top view of a data processing system 160, also referred to herein as a blade center 160, that includes a chassis 161. Chassis 161 defines various slots into which blades or modules 163 through 168 can be inserted. A blade or module, as used herein, refers to an enclosure that typically includes a printed circuit board and electronic components attached thereto. Blades/modules 163 through 168 may include two or more server blades (164 and 165), power supplies modules 163 and 166, and a switch module 168 that interconnects server blades 164 and 165. Server blades 164 and 165 comprises single board data processing systems that include processors, system memory, and I/O devices such as persistent storage and network adapters.

In the depicted embodiment, blade center 160 includes a mid-plane 162 into which the blades/module 163 through 168 connect. The mid-plane 162 of blade center 160 is off-center such that the length of blades 163 through 165 is greater than the length of blades 166 and 168. In this case, the power supply module 163 and power supply module 166 are of different dimensions.

The power supply housing 100 described above is suitable for use in blade center 160. Specifically, housing 100 can be used in blade center to enable the use of a single type of power supply unit (e.g., a single power supply unit model number) in the slots for both power supply modules. The first power supply module 163 (shown from side view above blade center 160) includes a first power supply unit 165A located within a first adjustable housing 100A while the second power supply module 166 includes a second power supply unit 165B within a second adjustable housing 100B. First and second power supply units 165A and 165B are preferably of the same make and model such that the have substantially the same electrical and mechanical characteristics. Adjustable housing 100A is extended to conform to the longer blade center slot into which power supply module 163 is inserted while adjustable housing 100B is contracted to conform to the short blade center slot into which power supply module 166 is inserted. It will also be appreciated, from the preceding description and illustration of housing 100, that housings 100A and 100B may have different air gap configurations that are appropriate for their respective blade center slots. By defining and employing an adjustable power supply housing according to the present invention, a single type of power supply unit may be for applications that have different mechanical and/or air flow characteristics and requirements. The ability to use a single type of power supply unit beneficially simplifies the design and manufacturing of data processing systems such as blade center 160. Although the adjustable size utility of the present invention is illustrated as employed in a blade center application, it will be appreciated that the use of adjustable power supply housing 100 is also applicable in the context of potentially any two data processing systems that have different mechanical and/or air flow requirements.

It will be apparent to those skilled in the art having the benefit of this disclosure that an adjustable housing for a data processing system power supply is described with sufficient detail to enable one skilled in the art to make and use the invention. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A housing for a power supply unit in a data processing system, comprising:

a carrier bracket suitable for attachment to the power supply unit, the carrier bracket comprising a first plate and first and second arms extending from the first plate;

a housing tray comprising a rectangular base plate and first and second sidewalls, parallel to each other, configured to engage the first and second arms of the carrier bracket; and a baffle comprising a rectangular baffle plate having a first edge hinged to the housing tray wherein the baffle is enabled to pivot around the hinge between a closed position with the baffle plate in contact with upper edges of the housing tray sidewalls and an open position, and wherein pivot points about which the baffle pivots are moveable with respect to the housing tray such that the housing tray and the baffle define an adjustable air gap;

wherein exterior surfaces of the carrier bracket arms define a first set of tracks and the interior surfaces of the housing tray sidewalls define a second set of tracks suitable for engaging the first set of tracks enabling the carrier bracket to engage the housing tray wherein the carrier bracket and housing tray are slidable with respect to each other for adjusting a dimension of the housing enclosure.

2. The housing of claim 1, wherein the carrier bracket first plate defines an opening suitable for power supply cabling can pass and wherein the first and second carrier bracket arms define openings suitable for attaching a power supply unit to the carrier bracket.

3. The housing of claim 1, wherein the first face of the carrier bracket defines a second end of the housing and a third sidewall of the housing defines a second end of the housing when the carrier bracket engages the housing tray.

4. The housing of claim 1, wherein the baffle comprises a first baffle plate and a second baffle plate that extends relative to the first baffle plate such that the distal edge of the baffle plate is adjustable.

5. The housing of claim 1, wherein the baffle includes a pair of pivot points about which the baffle plate pivots, wherein the pivot points are engaged in a baffle track defined in the parallel sidewalls of the housing tray.

6. The housing of claim 3, wherein, when the baffle is in the closed position, a second gap is defined between the distal edge of the baffle and the first face of the carrier bracket.

7. A data processing system, including a chassis defining a plurality of slots for receiving modules including first and second power supply modules, wherein the first and second slots are of different dimensions and wherein the first and second power supply modules each includes a power supply unit within an aluminum power supply housing, wherein each housing includes a carrier bracket suitable for attaching to the corresponding power supply unit, a housing tray configured to engage the carrier bracket moveably and thereby define an adjustable space for receiving the power supply unit; and, a baffle hinged to the housing tray to cover a portion of the space, wherein the baffle is moveable relative to the housing tray.

8. The system of claim 7, wherein each of the power supply units have the same mechanical and electrical characteristics and wherein the power supply housings are sized differently to accommodate their respective slots.

9. The system of claim 7, wherein the carrier bracket comprises a face plate and a parallel pair of arms extending from the face plate to form a c-shaped bracket and wherein the housing tray includes a rectangular base and sidewalls on three of the four edges of the perimeter.

10. The system of claim 9, wherein the baffle is hinged via pivot points engaged in baffle tracks in two of the housing tray sidewalls and wherein the baffle dimensions and position define a first gap between a hinged edge of the baffle and a sidewall of the housing tray.

11. The system of claim 10, wherein the baffle dimensions and position define a second gap between a distal edge of the baffle and the carrier bracket face plate.

12. The system of claim 11, wherein the baffle includes a plurality of baffle plates, the baffle plates being extendible to alter the baffle dimensions.

* * * * *